United States Patent
Huang et al.

(10) Patent No.: US 10,234,341 B2
(45) Date of Patent: Mar. 19, 2019

(54) FINGER MOVEMENT-SENSING ASSEMBLY

(71) Applicant: TAIWAN ALPHA ELECTRONIC CO., LTD., Taoyuan (TW)

(72) Inventors: Tzu-Hsuan Huang, Taoyuan (TW); Wei-Liang Liu, Taoyuan (TW)

(73) Assignee: Taiwan Alpha Electronic Co., Ltd., Taoyuan (TW)

( * ) Notice: Subject to any disclaimer, the term of this patent is extended or adjusted under 35 U.S.C. 154(b) by 0 days.

(21) Appl. No.: 15/990,479

(22) Filed: May 25, 2018

(65) Prior Publication Data

US 2018/0364114 A1 Dec. 20, 2018

(30) Foreign Application Priority Data

Jun. 20, 2017 (TW) .............................. 106120592 A

(51) Int. Cl.
*G01L 5/16* (2006.01)
*G01L 1/20* (2006.01)
*H05K 1/14* (2006.01)

(52) U.S. Cl.
CPC .............. *G01L 1/205* (2013.01); *H05K 1/147* (2013.01); *H05K 2201/042* (2013.01); *H05K 2201/10151* (2013.01)

(58) Field of Classification Search
CPC ...... G01L 1/205; G06K 9/0002; H05K 1/147; H05K 2201/042; H05K 2201/10151; A41D 19/00
See application file for complete search history.

(56) References Cited

U.S. PATENT DOCUMENTS

| | | | | |
|---|---|---|---|---|
| 9,529,433 | B2 * | 12/2016 | Shankar | ................... G06F 3/014 |
| 2009/0257626 | A1 * | 10/2009 | Sherlock | ............ G06K 9/00013 |
| | | | | 382/126 |
| 2013/0259329 | A1 * | 10/2013 | Wickboldt | ............. H05K 1/189 |
| | | | | 382/124 |
| 2014/0161309 | A1 * | 6/2014 | Chiang | ................... G06F 3/017 |
| | | | | 382/103 |
| 2016/0253542 | A1 * | 9/2016 | Lee | ....................... G06K 9/0002 |
| | | | | 382/126 |

FOREIGN PATENT DOCUMENTS

| | | |
|---|---|---|
| CN | 105725312 A | 7/2016 |
| CN | 205508194 U | 8/2016 |
| CN | 206101715 U | 4/2017 |
| TW | 201631516 A | 9/2016 |

* cited by examiner

*Primary Examiner* — Lisa M Caputo
*Assistant Examiner* — Nigel H Plumb
(74) *Attorney, Agent, or Firm* — Muncy, Geissler, Olds & Lowe, P.C.

(57) ABSTRACT

A finger movement-sensing assembly includes a flexible substrate, a bend-sensing circuit structure and a depression-sensing circuit structure. The flexible substrate extends in a first direction for use on a finger. The flexible substrate has an outer extension section and an inner deflection section. The outer extension section is applied to be mounted onto a back of the finger, and the inner deflection section is applied to be mounted onto a pulp of the finger. The bend-sensing circuit structure is disposed on the outer extension section to produce a bend-sensing signal. The depression-sensing circuit structure is disposed on the inner deflection section to produce a depression-sensing signal.

8 Claims, 8 Drawing Sheets

FINGER MOVEMENT-SENSING ASSEMBLY

This application claims the benefit of Taiwan Patent Application Serial No. 106120592, filed on Jun. 20, 2017, the subject matter of which is incorporated herein by reference.

BACKGROUND OF THE INVENTION

1. Field of the Invention

The invention relates to a sensing assembly, and more particularly to a finger movement-sensing assembly for detecting movements of a finger.

2. Description of the Prior Art

Recently, with the progress of technology, the application of sensors to detect movements of a human finger becomes more and more popular in various field. For example, the sensor can be used to detect movements of user's finger so as to generate corresponding operational signal. In addition, the sensor can also be used to detect a finger of a robot. Currently, a typical finger-movement senor mainly applies bend-sensing assembly to detect motions of the finger, such that a bend degree of the finger can be obtained. Though such a conventional sensing means can detect the bend degree of user's finger, yet it can't be applied to detect a robotic finger. When a robotic finger is used to handle an object, a bend degree of the robotic finger cannot be directly transformed into the corresponding application forcing upon the object. Namely, while in handling another object, though the bend degree of the robotic finger upon this another object can be determined by using the bend-sensing assembly, yet the forcing upon this another object cannot be realized even the bend degrees for the two different objects are the same. Thereupon, excessive application forcing is usually generated to damage the object.

SUMMARY OF THE INVENTION

In viewing the aforesaid art, it is obvious that the conventional finger movement-sensing assembly can only detect the bend degree of finger, but not the corresponding forcing. Thus, to handle different objects in the same bend degree, situations of excessive and/or insufficient forcing are usually met. Accordingly, it is an object of the present invention to provide a finger movement-sensing assembly, that can apply an assembly of a bend-sensing circuit structure and a depression-sensing circuit structure to make clear the application forcing at the same time of sensing the bend degree of a human or robotic finger.

In the present invention, the finger movement-sensing assembly includes a flexible substrate, a bend-sensing circuit structure and a depression-sensing circuit structure.

The flexible substrate extends in a first direction, applies to be mounted on a finger, and has an outer extension section applied to be mounted on a back of the finger and an inner deflection section connected with the outer extension section.

The bend-sensing circuit structure, located in the outer extension section, is to detect a bend degree of the finger so as to generate a bend-sensing signal. The depression-sensing circuit structure, located in the inner deflection section, is to detect a depression degree of the finger so as to generate a depression-sensing signal.

In one embodiment of the present invention, the flexible substrate includes a first circuit layout layer, a spacer layer and a second circuit layout layer. The first circuit layout layer extends in the first direction. The bend-sensing circuit structure has a first bend-sensing circuit and a second bend-sensing circuit to be constructed oppositely on first circuit layout layer in the outer extension section. The depression-sensing circuit structure has a first depression-sensing circuit and a second depression-sensing circuit to be constructed oppositely on the first circuit layout layer in the inner deflection section.

The spacer layer, overlapping the first circuit layout layer, is furnished with a first perforation and a second perforation. The first perforation and the second perforation are located in the outer extension section and the inner deflection section, respectively. The first bend-sensing circuit and the second bend-sensing circuit are exposed via the first perforation, and the first depression-sensing circuit and second depression-sensing circuit is exposed via the second perforation.

The second circuit layout layer overlaps the spacer layer. A bend-detection conducting circuit and a depression-detection conducting circuit of the bend-sensing circuit structure are furnished to the second circuit layout layer in the outer extension section and the inner deflection section, respectively.

When the outer extension section is bent, the bend-detection conducting circuit exposes out of the first perforation to conduct electrically the first bend-sensing circuit and the second bend-sensing circuit so as to generate the bend-sensing signal. In addition, when the inner deflection section is depressed, the depression-detection conducting circuit exposes out of the second perforation to conduct electrically the first depression-sensing circuit and the second depression-sensing circuit so as to generate the depression-sensing signal.

Preferably, the first bend-sensing circuit includes a first bend-detection circuit-collecting portion and a plurality of first bend-detection circuit-protruding portions, the second bend-sensing circuit includes a second bend-detection circuit-collecting portion and a plurality of second bend-detection circuit-protruding portions, the first bend-detection circuit-collecting portion and the second bend-detection circuit-collecting portion are extended longitudinally and parallel on the first circuit layout layer in the outer extension section, the plurality of first bend-detection circuit-protruding portions integrated as a unique piece with the first bend-detection circuit-collecting portion extend parallel to each other and toward the second bend-detection circuit-collecting portion, the plurality of second bend-detection circuit-protruding portions integrated as a unique piece with the second bend-detection circuit-collecting portion extend parallel to each other and toward the first bend-detection circuit-collecting portion, and the plurality of first bend-detection circuit-protruding portions and the plurality of second bend-detection circuit-protruding portions are formulated together into a parallel staggered arrangement.

Preferably, the first depression-sensing circuit includes a first depression-detection circuit-collecting portion and a plurality of first depression-detection circuit-protruding portions, the second depression-sensing circuit includes a second depression-detection circuit-collecting portion and a plurality of second depression-detection circuit-protruding portions, the first depression-detection circuit-collecting portion and the second depression-detection circuit-collecting portion are constructed oppositely on the first circuit layout layer in the inner deflection section, the plurality of first depression-detection circuit-protruding portions integrated as a unique piece with the first depression-detection circuit-collecting portion extend parallel to each other and toward the second depression-detection circuit-collecting portion, the plurality of second depression-detection circuit-protruding portions integrated as a unique piece with the second depression-detection circuit-collecting portion extend parallel to each other and toward the first depression-detection circuit-collecting portion, and the plurality of first depression-detection circuit-protruding portions and the plurality of second depression-detection circuit-protruding portions are formulated together into a parallel staggered arrangement.

In another embodiment of the present invention, the flexible substrate further includes a buffer layer and an enforcement layer. The buffer layer overlaps one of the first circuit layout layer and second circuit layout layer, and the enforcement layer overlaps the buffer layer.

Preferably, the flexible substrate includes a first circuit layout layer, a spacer layer and a second circuit layout layer. The first circuit layout layer extends in the first direction. A first bend-sensing circuit and a second bend-sensing circuit of the bend-sensing circuit structure are located oppositely on the first circuit layout layer in the outer extension section. A bend-detection conducting circuit of the bend-sensing circuit structure is located on the first circuit layout layer in the inner deflection section.

The spacer layer, overlapping the first circuit layout layer, is furnished with a first perforation and a second perforation. The first perforation and the second perforation are located in the outer extension section and the inner deflection section, respectively. The first bend-sensing circuit and the second bend-sensing circuit are exposed via the first perforation, and the depression-detection conducting circuit is exposed via the second perforation.

The second circuit layout layer overlaps the spacer layer. A first depression-sensing circuit and a second depression-sensing circuit of the depression-sensing circuit structure are located oppositely on the second circuit layout layer in the inner deflection section. A bend-detection conducting circuit of the bend-sensing circuit structure is located on the second circuit layout layer in the outer extension section.

When the outer extension section is bent, the bend-detection conducting circuit is exposed out of the first perforation to electrically conduct the first bend-sensing circuit and the second bend-sensing circuit so as to generate a bend-sensing signal. When the inner deflection section is depressed, the depression-detection conducting circuit is exposed out of the second perforation to electrically conduct the first depression-sensing circuit and the second depression-sensing circuit so as to generate a depression-sensing signal.

Preferably, the first bend-sensing circuit includes a first bend-detection circuit-collecting portion and a plurality of first bend-detection circuit-protruding portions, the second bend-sensing circuit includes a second bend-detection circuit-collecting portion and a plurality of second bend-detection circuit-protruding portions, the first bend-detection circuit-collecting portion and the second bend-detection circuit-collecting portion are extended longitudinally and parallel on the first circuit layout layer in the outer extension section, the plurality of first bend-detection circuit-protruding portions integrated as a unique piece with the first bend-detection circuit-collecting portion extend parallel to each other and toward the second bend-detection circuit-collecting portion, the plurality of second bend-detection circuit-protruding portions integrated as a unique piece with the second bend-detection circuit-collecting portion extend parallel to each other and toward the first bend-detection circuit-collecting portion, and the plurality of first bend-detection circuit-protruding portions and the plurality of second bend-detection circuit-protruding portions are formulated together into a parallel staggered arrangement.

Preferably, the first depression-sensing circuit includes a first depression-detection circuit-collecting portion and a plurality of first depression-detection circuit-protruding portions, the second depression-sensing circuit includes a second depression-detection circuit-collecting portion and a plurality of second depression-detection circuit-protruding portions, the first depression-detection circuit-collecting portion and the second depression-detection circuit-collecting portion are constructed oppositely on the second circuit layout layer in the inner deflection section, the plurality of first depression-detection circuit-protruding portions integrated as a unique piece with the first depression-detection circuit-collecting portion extend parallel to each other and toward the second depression-detection circuit-collecting portion, the plurality of second depression-detection circuit-protruding portions integrated as a unique piece with the second depression-detection circuit-collecting portion extend parallel to each other and toward the first depression-detection circuit-collecting portion, and the plurality of first depression-detection circuit-protruding portions and the plurality of second depression-detection circuit-protruding portions are formulated together into a parallel staggered arrangement.

In addition, the flexible substrate further includes a buffer layer and an enforcement layer. The buffer layer overlaps one of the first circuit layout layer and the second circuit layout layer, and the enforcement layer overlaps the buffer layer.

As stated above, the finger movement-sensing assembly provided by the present invention has the bend-sensing circuit structure and the depression-sensing circuit structure to be constructed on the flexible substrate. Thus, the bend-sensing circuit structure can be applied effectively to detect the bend degree of the finger, and the depression-sensing circuit structure can be applied effectively to detect the forcing upon an object held or depressed by the finger.

All these objects are achieved by the finger movement-sensing assembly described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a finger movement-sensing assembly. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
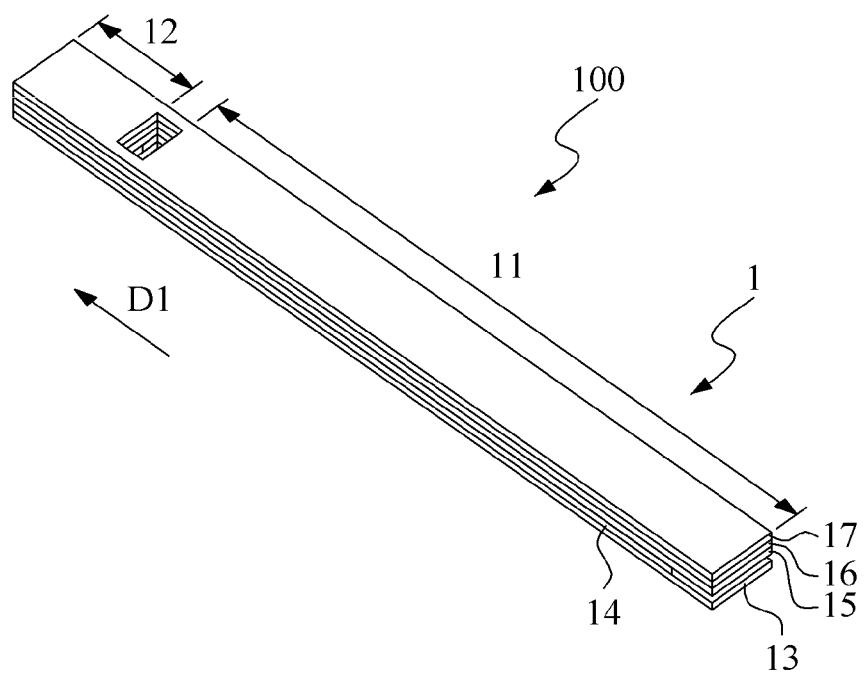
FIG. 1 is a schematic perspective view of a preferred embodiment of the finger movement-sensing assembly in accordance with the present invention.
Figure 2:
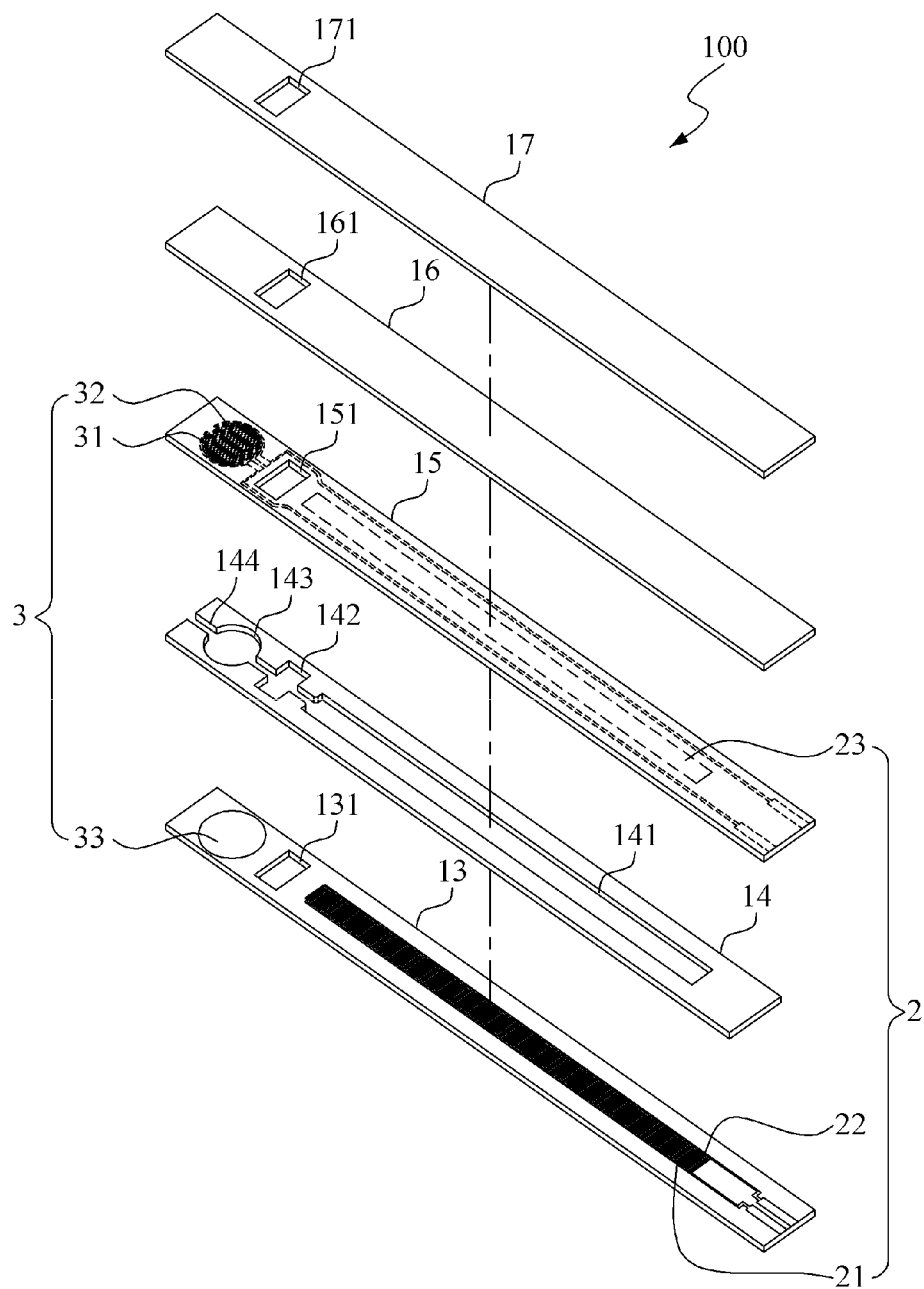
FIG. 2 is a schematic exploded view of FIG. 1.

Refer now to FIG. 1 and FIG. 2; where FIG. 1 is a schematic perspective view of a preferred embodiment of the finger movement-sensing assembly in accordance with the present invention, and FIG. 2 is a schematic exploded view of FIG. 1. As shown, the finger movement-sensing assembly 100 includes a flexible substrate 1, a bend-sensing circuit structure 2 and a depression-sensing circuit structure 3.

The flexible substrate 1, extending in a first direction D1, has an outer extension section 11 and an inner deflection section 12. The inner deflection section 12 is connected with the outer extension section 11. The flexible substrate 1 further includes a first circuit layout layer 13, a spacer layer 14, a second circuit layout layer 15, a buffer layer 16 and an enforcement layer 17.

The first circuit layout layer 13, extending in the first direction D1, is furnished with a first intra-layer hole 131 located between the outer extension section 11 and the inner deflection section 12. In this embodiment, the first circuit layout layer 13 is a flexible printed circuit (FPC) board, and can be made of a polyimide (PI).

The spacer layer 14, overlapping the first circuit layout layer 13, is furnished with a first perforation 141, a spacer-layer hole 142, a second perforation 143 and a gas-exhausting channel 144. The first perforation 141 and the second perforation 143 are located in the outer extension section 11 and the inner deflection section 12, respectively. The spacer-layer hole 142, located between the first perforation 141 and the second perforation 143, is communicated spatially with the first intra-layer hole 131, and also connected spatially with the spacer-layer hole 142, the first perforation 141 and the second perforation 143. In addition, the gas-exhausting channel 144 is connected spatially with the second perforation 143. Practically, the spacer layer 14 is made of an insulating resin. The insulating resin is, but not limited to, one of a polyethylene and a polypropylene.

The second circuit layout layer 15, overlapping the spacer layer 14, is furnished with a second intra-layer hole 151 communicated spatially with the spacer-layer hole 142. The second circuit layout layer 15 and the first circuit layout layer 13 can be both the flexible printed circuit boards.

The buffer layer 16, overlapping the second circuit layout layer 15, is furnished with a buffer-layer hole 161 communicated spatially with the second intra-layer hole 151. Practically, the buffer layer 16 can be also made of the insulating resin.

The enforcement layer 17, overlapping the buffer layer 16, is furnished with an enforcement-layer hole 171 communicated spatially with the buffer-layer hole 161. Practically, the enforcement layer 17 can be made of a composite material with a higher strength, such as a fiber-reinforced plastic (FRP) formed by fibers and resins.

In this embodiment, since the first intra-layer hole 131, the spacer-layer hole 142, the second intra-layer hole 151, the buffer-layer hole 161 and the enforcement-layer hole 171 are mutually communicated spatially, thus a through hole (not labeled in the figure) can be integrally formed between the outer extension section 11 and the inner deflection section 12.

The bend-sensing circuit structure 2 includes a first bend-sensing circuit 21, a second bend-sensing circuit 22 and a bend-detection conducting circuit 23. The first bend-sensing circuit 21 and the second bend-sensing circuit 22, both in the outer extension section 11, are constructed longitudinally and oppositely on the same surface of the first circuit layout layer 13. The bend-detection conducting circuit 23 is constructed on the second circuit layout layer 15 in the outer extension section 11.

Figure 3:
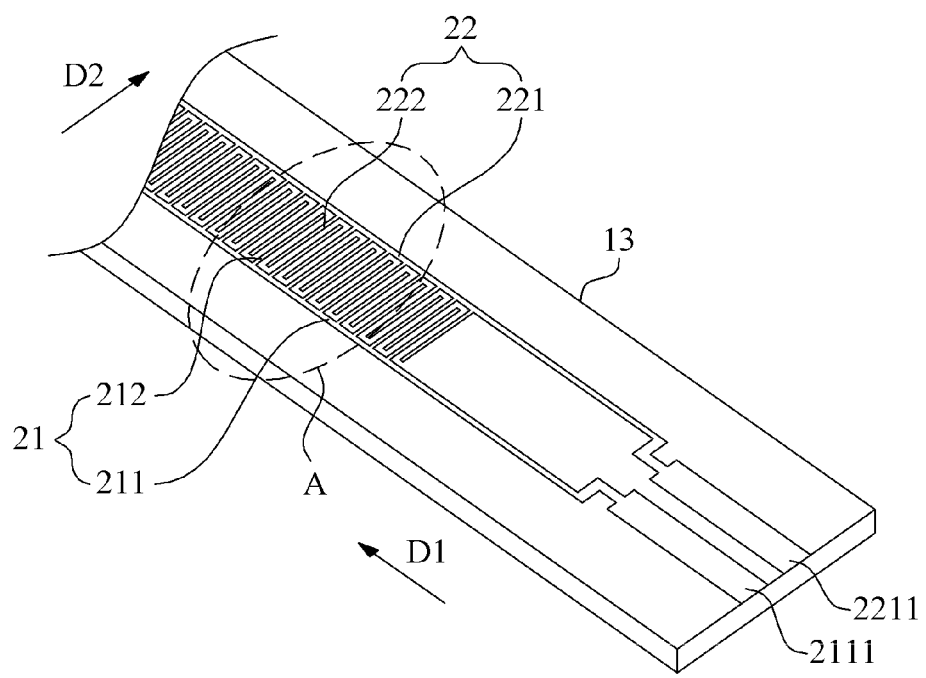
FIG. 3 is a schematic enlarged view of a portion of the first circuit layout layer of FIG. 2.
Figure 3A:
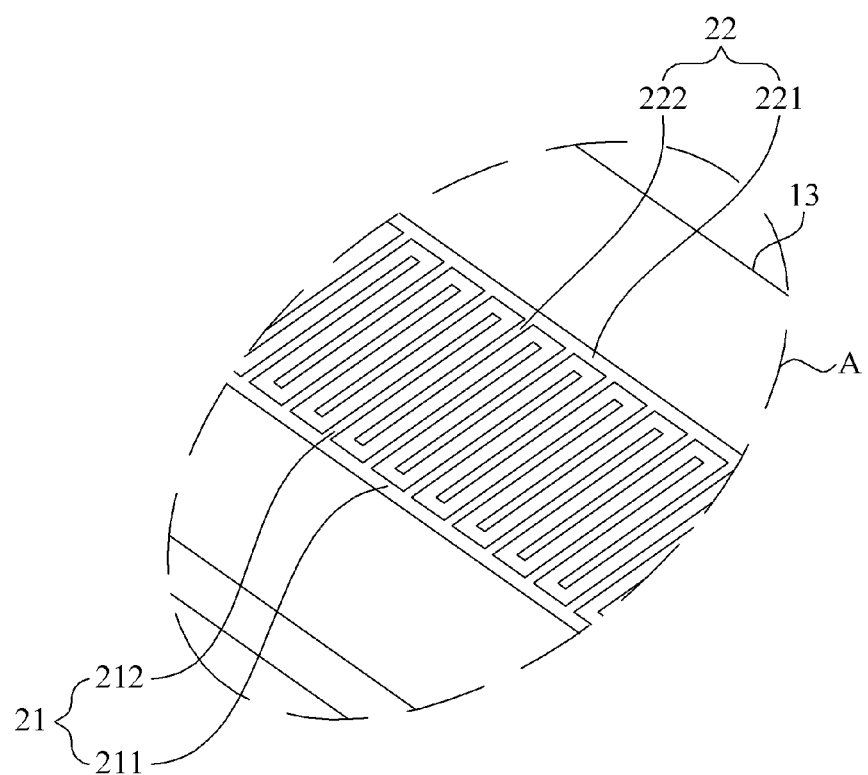
FIG. 3A is an enlarged view of area A of FIG. 3.

Refer now to FIG. 3 and FIG. 3A; where FIG. 3 is a schematic enlarged view of a portion of the first circuit layout layer of FIG. 2, and FIG. 3A is an enlarged view of area A of FIG. 3. As shown, the first bend-sensing circuit 21 further includes a first bend-detection circuit-collecting portion 211 and a plurality of first bend-detection circuit-protruding portions 212 (only one labeled in the figure). The first bend-detection circuit-collecting portion 211 extends along one side of the first circuit layout layer 13 in the outer extension section 11. The first bend-detection circuit-protruding portions 212, arranged in a parallel manner, are individually protruded from the first bend-detection circuit-collecting portion 211 and toward the second bend-sensing circuit 22 in a second direction D2 perpendicular to the first direction D1.

The second bend-sensing circuit 22 includes a second bend-detection circuit-collecting portion 221 and a plurality of second bend-detection circuit-protruding portions 222 (only one labeled in the figure). The second bend-detection circuit-collecting portion 221 extends along another side of the first circuit layout layer 13 in the outer extension section 11 by opposing to the first bend-detection circuit-collecting portion 211. The second bend-detection circuit-protruding portions 222, arranged also in a parallel manner, are individually protruded from the second bend-detection circuit-collecting portion 221 and toward the first bend-sensing circuit 21 in a direction reverse to the second direction D2. In the preferred embodiment, the first bend-detection circuit-protruding portions 212 and the second bend-detection circuit-protruding portions 222 are constructed in a parallel staggered arrangement. In addition, the first bend-detection circuit-collecting portion 211 and the second bend-detection circuit-collecting portion 221 further extends individually to form an electric port 2111 and an electric port 2211, respectively, at one same end of the first circuit layout layer 13.

In details, each of the first bend-detection circuit-protruding portions 212 protrudes from the first bend-detection circuit-collecting portion 211 as a unique piece by extending in the second direction D2 and toward the second bend-detection circuit-collecting portion 221 of the second bend-sensing circuit 22. On the other hand, each of the second bend-detection circuit-protruding portions 222 protrudes from the second bend-detection circuit-collecting portion 221 as a unique piece by extending in the opposite direction of the aforesaid second direction D2 and toward the first bend-detection circuit-collecting portion 211 of the first bend-sensing circuit 21. In addition, in other embodiments, the first bend-detection circuit-protruding portion 212 can protrude in an oblique angle to the first direction D1 to extend toward the second bend-detection circuit-collecting portion 221, and the second bend-detection circuit-protruding portion 222 can also protrude parallel to the first bend-detection circuit-protruding portion 212 and toward the first bend-detection circuit-collecting portion 211. Again, the first bend-detection circuit-protruding portions 212 and the second bend-detection circuit-protruding portions 222 are formulated together into a parallel staggered arrangement.

The bend-detection conducting circuit 23 is formed on the second circuit layout layer 15 in the outer extension section 11, by facing the first circuit layout layer 13.

In this embodiment, the first bend-sensing circuit 21 and the second bend-sensing circuit 22 are both formed as low-impedance conductive slurry coating, and the bend-detection conducting circuit 23 is formed as high-impedance conductive slurry coating.

The depression-sensing circuit structure 3 includes a first depression-sensing circuit 31, a second depression-sensing circuit 32 and a depression-detection conducting circuit 33.

The first depression-sensing circuit 31 and the second depression-sensing circuit 32, both in the inner deflection section 12, are constructed oppositely but facing each other on the same surface of the second circuit layout layer 15. The depression-detection conducting circuit 33 is constructed on the first circuit layout layer 13 in the inner deflection section 12.

Figure 4:
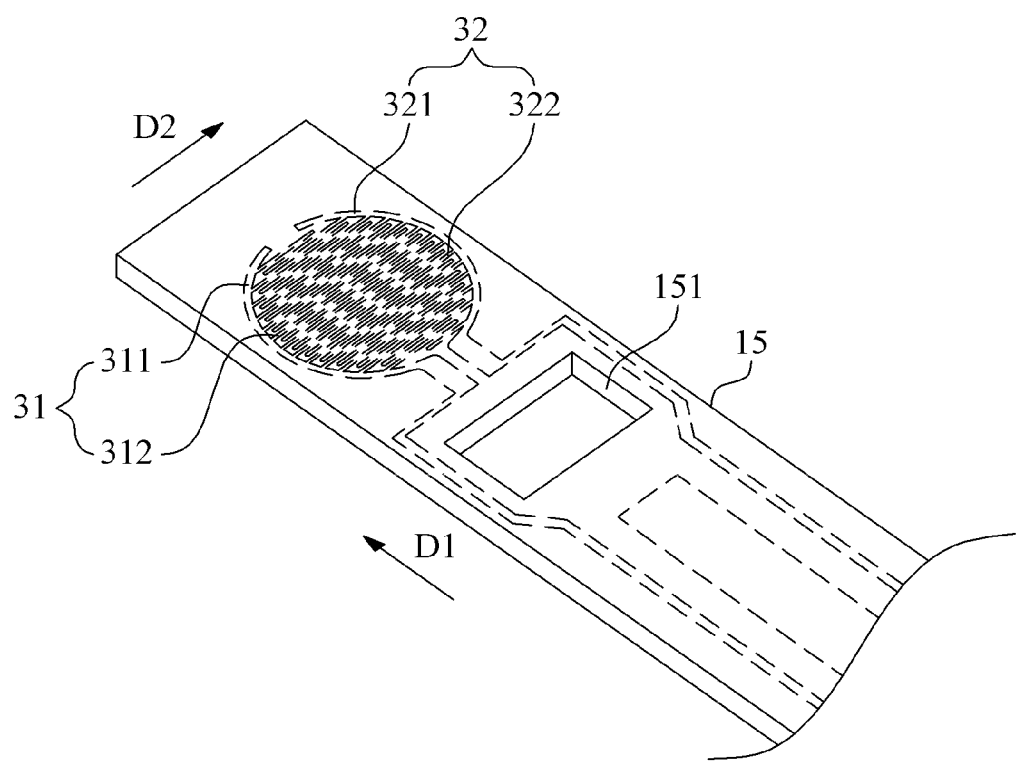
FIG. 4 is a schematic enlarged view of a portion of the second circuit layout layer of FIG. 2.

Referring now to FIG. 4, a schematic enlarged view of a portion of the second circuit layout layer of FIG. 2 is shown. The first depression-sensing circuit 31 further includes a first depression-detection circuit-collecting portion 311 and a plurality of first depression-detection circuit-protruding portions 312 (only one labeled in the figure).

The first depression-detection circuit-collecting portion 311, located in the inner deflection section 12, is furnished at one side of the second circuit layout layer 15, and each of the first depression-detection circuit-protruding portions 312 protrudes as a unique piece from the first depression-detection circuit-collecting portion 311, and extends in the second direction D2 and toward the second depression-sensing circuit 32. It is noted that the first depression-sensing circuit 31 is constructed on the surface of the second circuit layout layer 15 that faces the first circuit layout layer 13. Thus, the first depression-sensing circuit 31 is plotted by dashed lines in FIG. 4.

The second depression-sensing circuit 32 further includes a second depression-detection circuit-collecting portion 321 and a plurality of second depression-detection circuit-protruding portions 322 (only one labeled in the figure). The second depression-detection circuit-collecting portion 321, located in the inner deflection section 12, is constructed at another side of the second circuit layout layer 15 by opposing to the first depression-detection circuit-collecting portion 311. Each of the second depression-detection circuit-protruding portions 322 protrudes as a unique piece from the second depression-detection circuit-collecting portion 321, and extends in a direction opposing to the second direction D2 and toward the first depression-sensing circuit 31. The second depression-detection circuit-protruding portions 322 and the first depression-detection circuit-protruding portions 312 are formulated together into a parallel staggered arrangement. In addition, in other embodiments, the first depression-detection circuit-protruding portions 312 and the second depression-detection circuit-protruding portions 322 can extend parallel and by an oblique angle to the first direction D1, unlike the previous arrangement of extending in the second direction D2 perpendicular to the first direction D1.

In this embodiment, the first depression-sensing circuit 31 and the second depression-sensing circuit 32 are both formed as low-impedance conductive slurry coating, while the depression-detection conducting circuit 33 is formed as high-impedance conductive slurry coating.

In addition, while the spacer layer 14 is overlapped onto the first circuit layout layer 13, the first bend-sensing circuit 21 and the second bend-sensing circuit 22 are exposed via the first perforation 141 of the spacer layer 14, and the depression-detection conducting circuit 33 is exposed via the second perforation 143.

As described above, in this embodiment, the first bend-sensing circuit 21 and the second bend-sensing circuit 22, both in the outer extension section 11, are furnished on the first circuit layout layer 13 with the first bend-detection circuit-protruding portions 212 of the first bend-sensing circuit 21 and the second bend-detection circuit-protruding portions 222 of the second bend-sensing circuit 22 formulated by mixing into a parallel staggered arrangement. Thus, when the outer extension section 11 of the flexible substrate 1 is bent, the bend-detection conducting circuit 23 on the second circuit layout layer 15 would be exposed out of the first perforation 141 to contact and conduct the first bend-detection circuit-protruding portions 212 and the corresponding second bend-detection circuit-protruding portions 222. The number of successful conduction in between would depend on the bend degree. Since the bend-detection conducting circuit 23 of the present invention is formed as the high-impedance conductive slurry coating, thus the resistance for bend signals outputted from the first bend-detection circuit-collecting portion 211 and the second bend-detection circuit-collecting portion 221 would be relatively reduced as the bend degree of the outer extension section 11 grows.

On the other hand, the first depression-sensing circuit 31 and the second depression-sensing circuit 32 are both furnished on the second circuit layout layer 15 in the inner deflection section 12, and the first depression-detection circuit-protruding portions 312 of the first depression-sensing circuit 31 and the second depression-detection circuit-protruding portions 322 of the second depression-sensing circuit 32 are integrally formulated into a parallel staggered arrangement. Thus, when the inner deflection section 12 of the flexible substrate 1 is depressed, the depression-detection conducting circuit 33 of the first circuit layout layer 13 would be exposed out of the second perforation 143 to contact and conduct the first depression-detection circuit-protruding portions 312 and the corresponding second depression-detection circuit-protruding portions 322. The number of successful conduction would be proportional to the depression degree. In addition, since the depression-detection conducting circuit 33 of this embodiment is formed as the high-impedance conductive slurry coating, thus the resistance for depression-sensing signals outputted from the first depression-detection circuit-collecting portion 311 and the second depression-detection circuit-collecting portion 321 would be relatively reduced as the depression degree of the inner deflection section 12 grows. Thereupon, when the finger movement-sensing assembly 100 is set to a finger, the bend-sensing circuit structure 2 and the depression-sensing circuit structure 3 can be used to detect the bend degree and the depression degree of the finger.

Figure 5:
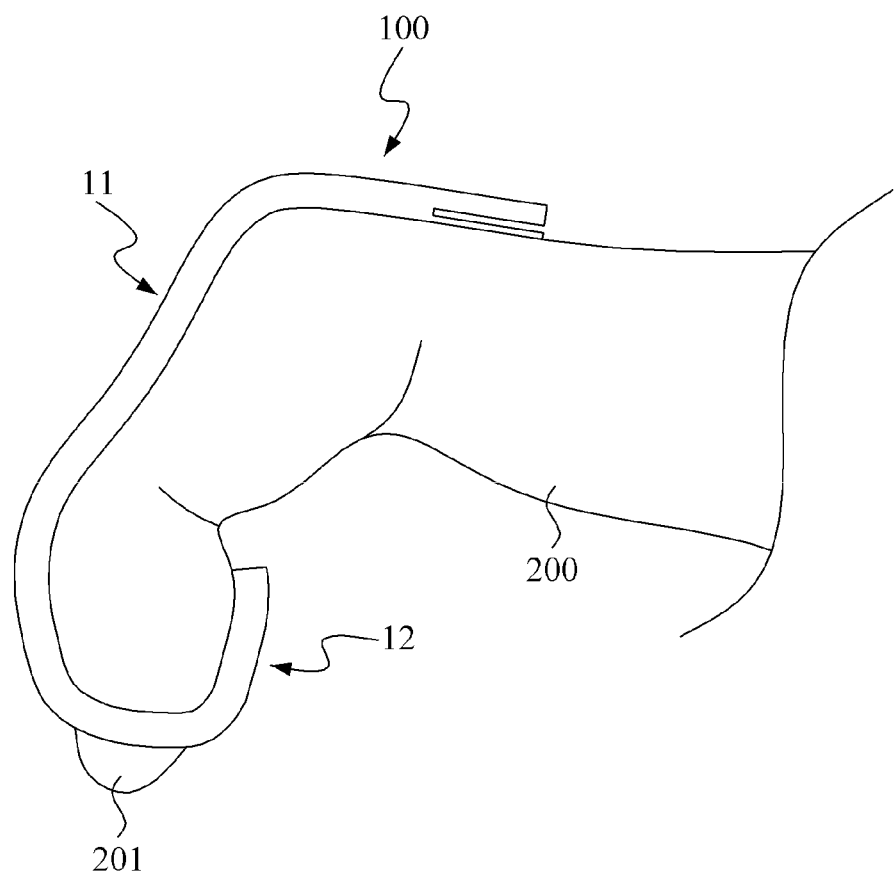
FIG. 5 is a schematic view showing an application of the finger movement-sensing assembly on a finger.

Referring now to FIG. 5, a schematic view showing an application of the finger movement-sensing assembly on a finger is provided. As shown, in practice, the outer extension section 11 would be set on a back of the finger 200, while the inner deflection section 12 is deflected inward to be set on a pulp of the finger 200. Thereupon, when the finger 200 is bent, the bend-sensing circuit structure 2 on the outer extension section 11 would be applied to perform detection. On the other hand, when the finger 200 is used to depress, the depression-sensing circuit structure 3 on the inner deflection section 12 would be applied to perform detection. In this embodiment, since a through hole exists to communicate spatially the outer extension section 11 and the inner deflection section 12, thus the finger tip 201 of the finger 200 can be set to the through hole so as to stabilize the finger movement-sensing assembly 100 on the finger 200. In addition, though the finger 200 in this embodiment is a human finger, yet, in some other embodiments, the finger 200 can be a robotic finger.

Figure 6:
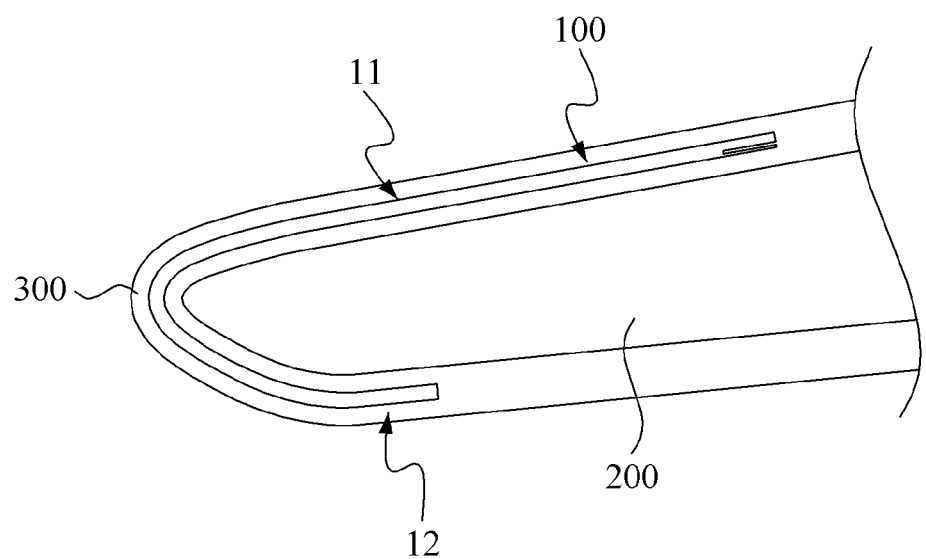
FIG. 6 is a schematic view showing an application of the finger movement-sensing assembly on another finger, with the finger movement-sensing assembly arranged in a glove.

Referring now to FIG. 6, a schematic view showing an application of the finger movement-sensing assembly on another finger, with the finger movement-sensing assembly arranged in a glove is provided. As shown, practically, the finger movement-sensing assembly 100 can be further set into a glove 300. Thus, while user's finger 200 wears the glove 300, the outer extension section 11 can be made to be positioned on the back of the finger 200, and the inner deflection section 12 is made to be positioned on the pulp of the finger 200.

Figure 7:
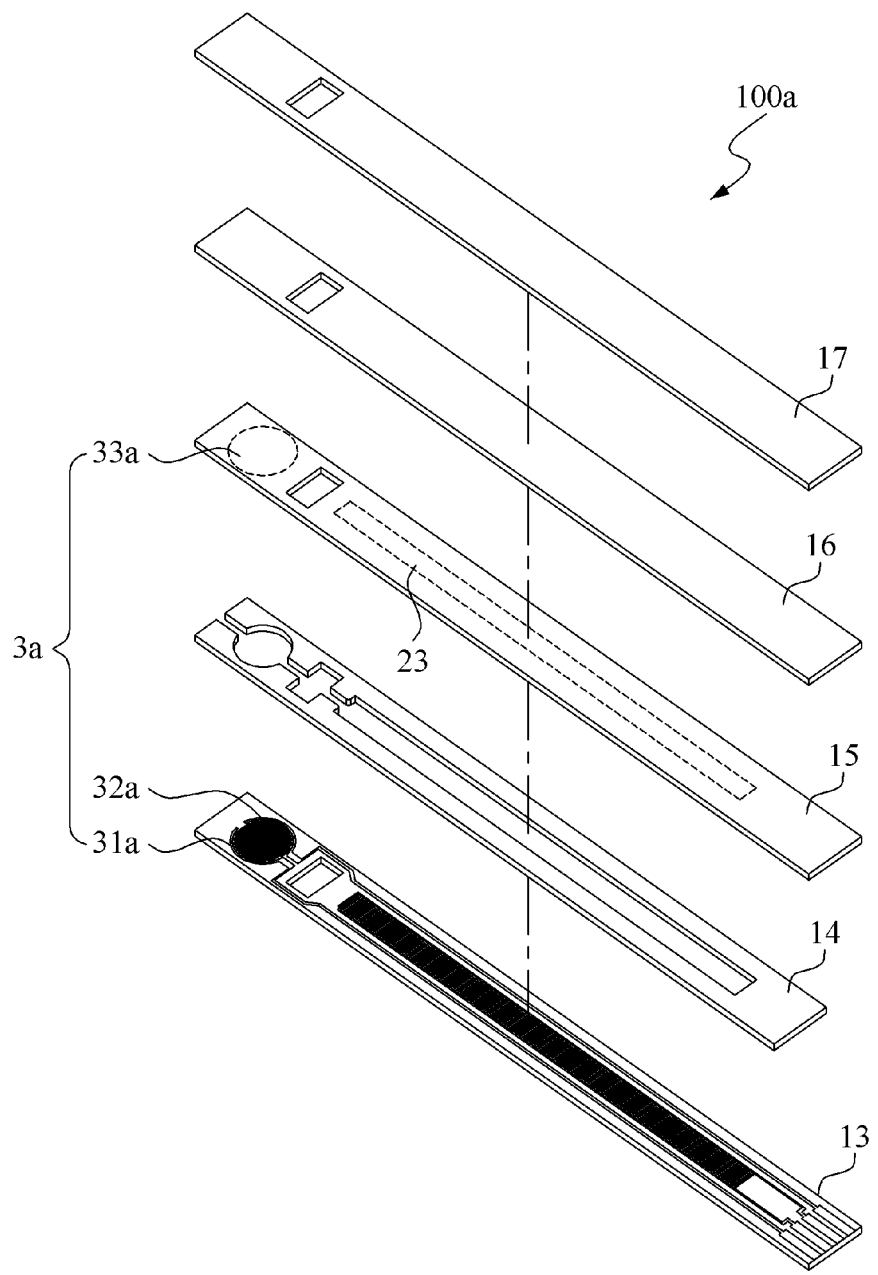
FIG. 7 is a schematic exploded view of another embodiment of the finger movement-sensing assembly in accordance with the present invention.

Referring now to FIG. 7, a schematic exploded view of another embodiment of the finger movement-sensing assembly in accordance with the present invention is shown. In this embodiment, the finger movement-sensing assembly 100a is largely resembled to that 100 of FIG. 2. The major difference in between is that, in this embodiment, the finger movement-sensing assembly 100a adopts a depression-sensing circuit structure 3a to replace the aforesaid depression-sensing circuit structure 3.

The depression-sensing circuit structure 3a includes a first depression-sensing circuit 31a, a second depression-sensing circuit 32a and a depression-detection conducting circuit 33a. However, in comparison with the aforesaid preferred embodiment whose first depression-sensing circuit 31 and second depression-sensing circuit 32 are constructed to opposing sides of the second circuit layout layer 15 in the inner deflection section 12, the depression-detection conducting circuit 33a is furnished to the first circuit layout layer 13 in the inner deflection section 12, while the first depression-sensing circuit 31a and the second depression-sensing circuit 32a of the depression-sensing circuit structure 3a are furnished to opposing sides of the first circuit layout layer 13 in the inner deflection section 12. Also, the depression-detection conducting circuit 33a is furnished to the second circuit layout layer 15 in the inner deflection section 12.

As described above, in the present invention, the finger movement-sensing assembly has the bend-sensing circuit structure and the depression-sensing circuit structure to be constructed on the flexible substrate. Thus, the bend-sensing circuit structure can be applied effectively to detect the bend degree of the finger, and the depression-sensing circuit structure can be applied effectively to detect the forcing upon an object held or depressed by the finger. In comparison with the prior art that the conventional finger movement-sensing detector can detect the bend degree of the finger by bending the sensing assembly, the finger movement-sensing assembly provided by the present invention can effectively detect different forcing upon the object held or depressed by the finger under the same bend degree.

While the present invention has been particularly shown and described with reference to a preferred embodiment, it will be understood by those skilled in the art that various changes in form and detail may be without departing from the spirit and scope of the present invention.

What is claimed is:

1. A finger movement-sensing assembly, comprising:
a flexible substrate, extending in a first direction, applied to be mounted on a finger, and having an outer extension section applied to be mounted on a back of the finger and an inner deflection section connected with the outer extension section, the flexible substrate including:
a first circuit layout layer, extending in the first direction;
a spacer layer, overlapping the first circuit layout layer, furnished with a first perforation and a second perforation, the first perforation and the second perforation being located in the outer extension section and the inner deflection section, respectively;
a second circuit layout layer, overlapping the spacer layer;
a bend-sensing circuit structure, located in the outer extension section, for detecting a bend degree of the finger so as to generate a bend-sensing signal, including a first bend-sensing circuit, a second bend-sensing circuit and a bend-detection conducting circuit, the first bend-sensing circuit and the second bend-sensing circuit both in the outer extension section being constructed longitudinally and oppositely on a same surface of the first circuit layout layer and exposed via the first perforation, the bend-detection conducting circuit being furnished to the second circuit layout layer in the outer extension section; and
a depression-sensing circuit structure, located in the inner deflection section, for detecting a depression degree of the finger so as to generate a depression-sensing signal, including a first depression-sensing circuit, a second depression-sensing circuit and a depression-detection conducting circuit, the first depression-sensing circuit and the second depression-sensing circuit both in the inner deflection section being constructed oppositely on another surface of the first circuit layout layer and exposed via the second perforation, the depression-detection conducting circuit being furnished to the second circuit layout layer in the inner deflection section;
wherein, when the outer extension section is bent, the bend-detection conducting circuit exposes out of the first perforation to conduct electrically the first bend-sensing circuit and the second bend-sensing circuit so as to generate the bend-sensing signal; and
wherein, when the inner deflection section is depressed, the depression-detection conducting circuit exposes out of the second perforation to conduct electrically the first depression-sensing circuit and the second depression-sensing circuit so as to generate the depression-sensing signal.

2. The finger movement-sensing assembly of claim 1, wherein the first bend-sensing circuit includes a first bend-detection circuit-collecting portion and a plurality of first bend-detection circuit-protruding portions, the second bend-sensing circuit includes a second bend-detection circuit-collecting portion and a plurality of second bend-detection circuit-protruding portions, the first bend-detection circuit-collecting portion and the second bend-detection circuit-collecting portion are extended longitudinally and parallel on the first circuit layout layer in the outer extension section, the plurality of first bend-detection circuit-protruding portions integrated as a unique piece with the first bend-detection circuit-collecting portion extend parallel to each other and toward the second bend-detection circuit-collecting portion, the plurality of second bend-detection circuit-protruding portions integrated as a unique piece with the second bend-detection circuit-collecting portion extend parallel to each other and toward the first bend-detection circuit-collecting portion, and the plurality of first bend-detection circuit-protruding portions and the plurality of second bend-detection circuit-protruding portions are formulated together into a parallel staggered arrangement.

3. The finger movement-sensing assembly of claim 1, wherein the first depression-sensing circuit includes a first depression-detection circuit-collecting portion and a plurality of first depression-detection circuit-protruding portions, the second depression-sensing circuit includes a second depression-detection circuit-collecting portion and a plurality of second depression-detection circuit-protruding portions, the first depression-detection circuit-collecting portion and the second depression-detection circuit-collecting portion are constructed oppositely on the first circuit layout layer in the inner deflection section, the plurality of first depression-detection circuit-protruding portions integrated as a unique piece with the first depression-detection circuit-collecting portion extend parallel to each other and toward the second depression-detection circuit-collecting portion, the plurality of second depression-detection circuit-protruding portions integrated as a unique piece with the second depression-detection circuit-collecting portion extend parallel to each other and toward the first depression-detection circuit-collecting portion, and the plurality of first depression-detection circuit-protruding portions and the plurality of second depression-detection circuit-protruding portions are formulated together into a parallel staggered arrangement.

4. The finger movement-sensing assembly of claim 1, wherein the flexible substrate further includes a buffer layer and an enforcement layer, the buffer layer overlaps one of the first circuit layout layer and the second circuit layout layer, and the enforcement layer overlaps the buffer layer.

5. A finger movement-sensing assembly, comprising:
a flexible substrate, extending in a first direction, applied to be mounted on a finger, having an outer extension section applied to be mounted on a back of the finger and an inner deflection section connected with the outer extension section, the flexible substrate including:
a first circuit layout layer, extending in the first direction;
a spacer layer, overlapping the first circuit layout layer, furnished with a first perforation and a second perforation, the first perforation and the second perforation being located in the outer extension section and the inner deflection section, respectively; and
a second circuit layout layer, overlapping the spacer layer;
a bend-sensing circuit structure, located in the outer extension section, for detecting a bend degree of the finger so as to generate a bend-sensing signal, including a first bend-sensing circuit, a second bend-sensing circuit and a bend-detection conducting circuit, the first bend-sensing circuit and the second bend-sensing circuit both in the outer extension section being constructed longitudinally and oppositely on a same surface of the first circuit layout layer and exposed via the first perforation, the bend-detection conducting circuit being furnished to the second circuit layout layer in the outer extension section; and
a depression-sensing circuit structure, located in the inner deflection section, for detecting a depression degree of the finger so as to generate a depression-sensing signal, including a first depression-sensing circuit, a second depression-sensing circuit and a depression-detection conducting circuit, the first depression-sensing circuit and the second depression-sensing circuit both in the inner deflection section being constructed oppositely on the second circuit layout layer, the depression-detection conducting circuit being constructed on the first circuit layout layer in the inner deflection section and exposed via the second perforation;
wherein, when the outer extension section is bent, the bend-detection conducting circuit exposes out of the first perforation to conduct electrically the first bend-sensing circuit and the second bend-sensing circuit so as to generate the bend-sensing signal;
wherein, when the inner deflection section is depressed, the depression-detection conducting circuit exposes out of the second perforation to conduct electrically the first depression-sensing circuit and the second depression-sensing circuit so as to generate the depression-sensing signal.

6. The finger movement-sensing assembly of claim 5, wherein the first bend-sensing circuit includes a first bend-detection circuit-collecting portion and a plurality of first bend-detection circuit-protruding portions, the second bend-sensing circuit includes a second bend-detection circuit-collecting portion and a plurality of second bend-detection circuit-protruding portions, the first bend-detection circuit-collecting portion and the second bend-detection circuit-collecting portion are extended longitudinally and parallel on the first circuit layout layer in the outer extension section, the plurality of first bend-detection circuit-protruding portions integrated as a unique piece with the first bend-detection circuit-collecting portion extend parallel to each other and toward the second bend-detection circuit-collecting portion, the plurality of second bend-detection circuit-protruding portions integrated as a unique piece with the second bend-detection circuit-collecting portion extend parallel to each other and toward the first bend-detection circuit-collecting portion, and the plurality of first bend-detection circuit-protruding portions and the plurality of second bend-detection circuit-protruding portions are formulated together into a parallel staggered arrangement.

7. The finger movement-sensing assembly of claim 5, wherein the first depression-sensing circuit includes a first depression-detection circuit-collecting portion and a plurality of first depression-detection circuit-protruding portions, the second depression-sensing circuit includes a second depression-detection circuit-collecting portion and a plurality of second depression-detection circuit-protruding portions, the first depression-detection circuit-collecting portion and the second depression-detection circuit-collecting portion are constructed oppositely on the second circuit layout layer in the inner deflection section, the plurality of first depression-detection circuit-protruding portions integrated as a unique piece with the first depression-detection circuit-collecting portion extend parallel to each other and toward the second depression-detection circuit-collecting portion, the plurality of second depression-detection circuit-protruding portions integrated as a unique piece with the second depression-detection circuit-collecting portion extend parallel to each other and toward the first depression-detection circuit-collecting portion, and the plurality of first depression-detection circuit-protruding portions and the plurality of second depression-detection circuit-protruding portions are formulated together into a parallel staggered arrangement.

8. The finger movement-sensing assembly of claim 5, wherein the flexible substrate further includes a buffer layer and an enforcement layer, the buffer layer overlaps one of the first circuit layout layer and the second circuit layout layer, and the enforcement layer overlaps the buffer layer.

* * * * *